United States Patent [19]
Chan

[11] Patent Number: 5,933,729
[45] Date of Patent: Aug. 3, 1999

[54] REDUCTION OF ONO FENCE DURING SELF-ALIGNED ETCH TO ELIMINATE POLY STRINGERS

[75] Inventor: Maria Chow Chan, San Jose, Calif.

[73] Assignee: Advanced Micro Devices, Inc., Sunnyvale, Calif.

[21] Appl. No.: 08/986,953

[22] Filed: Dec. 8, 1997

[51] Int. Cl.[6] .................................................. H01L 21/336
[52] U.S. Cl. ............................................................ 438/257
[58] Field of Search ..................................... 438/257, 258, 438/259, 260, 261, 262, 263, 264, 265

[56] References Cited

U.S. PATENT DOCUMENTS 5,258,095  11/1993  Nagata et al. ............................ 156/643
5,427,967   6/1995  Sadjadi et al. ............................. 437/43

*Primary Examiner*—Joni Chang
*Attorney, Agent, or Firm*—Renner, Otto Boisselle & Sklar, P.L.L.

[57] ABSTRACT

A method (200) of making a flash memory device without poly stringers includes forming a stacked gate region (202) on a substrate (102) and forming one or more word lines (122a, 122b, 204) in the stacked gate region. The method further includes performing a self-aligned etch (206) in regions adjacent to the one or more word lines (122a, 122b). The self-aligned etch (206) includes etching an insulating layer (110, 206a) with a relatively high insulating layer-to-polysilicon layer selectivity to thereby reduce the height of the resultant insulative fence (126). The self-aligned etch (206) then concludes with etching a polysilicon layer (106a, 106b); due to the reduced insulative fence (126), no poly stringers are formed during the etching of the polysilicon layer (106a, 106b).

16 Claims, 9 Drawing Sheets

REDUCTION OF ONO FENCE DURING SELF-ALIGNED ETCH TO ELIMINATE POLY STRINGERS

FIELD OF THE INVENTION

The present invention generally relates to integrated circuits and, in particular, to a method of flash memory fabrication which improves memory cell reliability and manufacturability by preventing the formation of poly stringers by reducing the height of the ONO (oxide-nitride-oxide) fence during a self-aligned etch step.

BACKGROUND OF THE INVENTION

Semiconductor devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically consist of at least one M×N array of individually addressable, substantially identical memory cells, and the low density peripheral portion 14 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 12 are coupled together in a circuit configuration, such as the configuration illustrated in prior art FIG. 2. Each memory cell 20 has a drain 22, a source 24 and a stacked gate 26. Each stacked gate 26 is coupled to a word line (WL0, WL1, . . . , WLn) while each drain 22 is coupled to a bit line (BL0, BL1, . . . , BLn). Lastly, each source 24 is coupled to a common source line CS. Using peripheral decoder and control circuitry, each memory cell 20 can be addressed for programming, reading or erasing functions.

Prior art FIG. 3 represents a fragmentary cross section diagram of a typical memory cell 20 in the core region 12 of prior art FIGS. 1 and 2. Such a cell 20 typically includes the source 24, the drain 22 and a channel 28 in a substrate 30; and the stacked gate structure 26 overlying the channel 28. The stacked gate 26 further includes a thin gate dielectric layer 32 (commonly referred to as the tunnel oxide) formed on the surface of the substrate 30. The stacked gate 26 also includes a polysilicon floating gate 34 which overlies the tunnel oxide 32 and an interpoly dielectric layer 36 overlies the floating gate 34. The interpoly dielectric layer 36 is often a multilayer insulator such as an oxide-nitride-oxide (ONO) layer having two oxide layers 36a and 36b sandwiching a nitride layer 36c. Lastly, a polysilicon control gate 38 overlies the interpoly dielectric layer 36. The control gates 38 of the respective cells 20 that are formed in a lateral row share a common word line (WL) associated with the row of cells (see, e.g., prior art FIG. 2). In addition, as highlighted above, the drain regions 22 of the respective cells in a vertical column are connected together by a conductive bit line (BL). The channel 28 of the cell 20 conducts current between the source 24 and the drain 22 in accordance with an electric field developed in the channel 28 by the stacked gate structure 26.

According to conventional operation, the flash memory cell 20 operates in the following manner. The cell 20 is programmed by applying a relatively high voltage $V_G$ (e.g., approximately 12 volts) to the control gate 38 and a moderately high voltage $V_D$ (e.g., approximately 9 volts) to the drain 22 in order to produce "hot" (high energy) electrons in the channel 28 near the drain 22. The hot electrons accelerate across the tunnel oxide 32 and into the floating gate 34 and become trapped in the floating gate 34 since the floating gate 34 is surrounded by insulators (the interpoly dielectric 36 and the tunnel oxide 32). As a result of the trapped electrons, the threshold voltage of the cell 20 increases by about 3 to 5 volts. This change in the threshold voltage (and thereby the channel conductance) of the cell 20 created by the trapped electrons is what causes the cell to be programmed.

To read the memory cell 20, a predetermined voltage $V_G$ that is greater than the threshold voltage of an unprogrammed cell, but less than the threshold voltage of a programmed cell, is applied to the control gate 38. If the cell 20 conducts, then the cell 20 has not been programmed (the cell 20 is therefore at a first logic state, e.g., a zero "0"). Likewise, if the cell 20 does not conduct, then the cell 20 has been programmed (the cell 20 is therefore at a second logic state, e.g., a one "1"). Consequently, one can read each cell 20 to determine whether it has been programmed (and therefore identify its logic state).

In order to erase the flash memory cell 20, a relatively high voltage $V_S$ (e.g, approximately 12 volts) is applied to the source 24 and the control gate 38 is held at a ground potential ($V_G$=0), while the drain 24 is allowed to float. Under these conditions, a strong electric field is developed across the tunnel oxide 32 between the floating gate 34 and the source region 22. The electrons that are trapped in the floating gate 34 flow toward and cluster at the portion of the floating gate 34 overlying the source region 22 and are extracted from the floating gate 34 and into the source region 22 by way of Fowler-Nordheim tunneling through the tunnel oxide 32. Consequently, as the electrons are removed from the floating gate 34, the cell 20 is erased.

During the processing of the core portion 12 having a circuit configuration as illustrated in prior art FIG. 2 and a structure as illustrated in prior art FIG. 3, a problem sometimes occurs involving poly stringers. The manner in which poly stringers are formed is illustrated in conjunction with prior art FIGS. 4a–7. Poly stringers result from (among other things) imperfect anisotropic etching of the floating polysilicon gate 34 (when delineating memory cells 20 along a given word line) and the subsequent shielding of some polysilicon material by an ONO "fence."

An ideally anisotropically etched polysilicon gate 40 is illustrated in prior art FIG. 4a with an oxide-nitride-oxide (ONO) layer 42 overlying the gate 40. Note that at regions 44 and 46 the ONO layer 42 exhibits a film thickness "X" while at a region 48 (along the sidewalls of the gate 40) the ONO layer 42 exhibits a film thickness "Y", wherein X<<Y. Consequently, as illustrated in prior art FIG. 4b, when the ONO layer 42 is subsequently etched, removing a film thickness of X, an ONO fence 50 is left along the sidewalls 52 and 54 of the polysilicon gate 40. Subsequently, when portions of the polysilicon gate 40 are again etched to define the various word lines for the memory device, the ONO fence 50 remains, as illustrated in prior art FIG. 4c.

The manner in which the ONO fence 50 remains after the second etching of the polysilicon gate 40 may best be understood in its macroscopic context, as illustrated in prior art FIG. 5. In FIG. 5, the polysilicon gate 40 rests on the substrate 30 (actually, it rests on a thin tunnel oxide which, although not shown for simplicity, overlies the substrate 30). The ONO fence 50 remains along the sidewalls 52 and 54 in the regions 60 and 62 where a first word line (WL1) and a second word line (WL2) are formed in a manner similar to prior art FIG. 4b. (Note that the additional layers that make up the stacked gate structure 26 are not shown in prior art FIG. 5 for the sake of simplicity.) In an etched region 64, which delineates the regions 60 and 62 (and consequently the word lines WL1 and WL2) the ONO fence 50 also remains in a manner similar to prior art FIG. 4c.

As long as the initial etching of the polysilicon gate 40 (which delineates cells 20 along a single word line) occurs in an ideally anisotropic manner, as illustrated in prior art FIGS. 4a–4c and FIG. 5, no poly stringers are formed during the second etching of the gate 40 (which delineates separate word lines). It is well known, however, that anisotropic etch processes do not repeatably provide ideally anisotropic profiles. Instead, most anisotropic etch processes provide non-ideal profiles in the range of about 85–95° (wherein 90° is ideal). A non-ideal anisotropic etch profile 65 is illustrated in prior art FIG. 6a. When the ONO layer 42 of FIG. 6a is etched, an angled ONO fence 68 is left on the sloped sidewalls 70 and 72 of the polysilicon gate 65 because the region 66 has a film thickness "Z" along the sidewalls 70 and 72 that is thicker than the film thickness "X". Consequently, the angled ONO fence 68 remains, as illustrated in prior art FIG. 6b.

When the polysilicon gate 65 is subsequently etched (in an anisotropic manner via, e.g., reactive ion etching (RIE)), as illustrated in prior art FIGS. 6b and 6c, the angled ONO fence 68 shields a portion of the polysilicon gate 65, resulting in remnants 74 and 76 of polysilicon, which are the poly stringers. Transposing the non-ideally anisotropic polysilicon gate 65 and the resulting poly stringers 74 and 76 of FIGS. 6a–6c into their macroscopic context (as illustrated in prior art FIG. 7), it is clear that the poly stringers 74 and 76 pose a substantial reliability problem since the poly stringers 74 and 76 in the etched region 64 can short out the word lines in regions 60 and 62, respectively. That is, instead of the etched region 64 electrically isolating the word lines in regions 60 and 62 from one another, the poly stringers 74 and 76 (which are conductive) span the etched region 64, shielded by the angled ONO fence 68 and cause the gates 65 in the regions 60 and 62 to be shorted together.

There is consequently a strong need for a method of fabricating memory devices that do not suffer the reliability problems caused by poly stringers.

SUMMARY OF THE INVENTION

The present invention embodies a method of preventing the formation of poly stringers during the fabrication of a memory device by reducing the height of the ONO fence during a self-aligned etch ("SAE") step. The shortened ONO fence provides reduced lateral shielding of polysilicon material during a subsequent polysilicon etch, thereby preventing poly stringers from being formed and improving the manufacturability of the memory device.

According to one aspect of the present invention, a new ONO etch recipe is utilized which exhibits a substantially greater ONO-to-polysilicon selectivity. Consequently, a longer overetch of the ONO layer may be conducted without substantially impacting the underlying polysilicon. The overetch reduces the height of the ONO fence and thereby reduces its lateral shielding of polysilicon. The reduced lateral shielding prevents the formation of poly stringers during a subsequent etch of the polysilicon.

To the accomplishment of the foregoing and related ends, the invention comprises the features hereinafter fully described and particularly pointed out in the claim. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
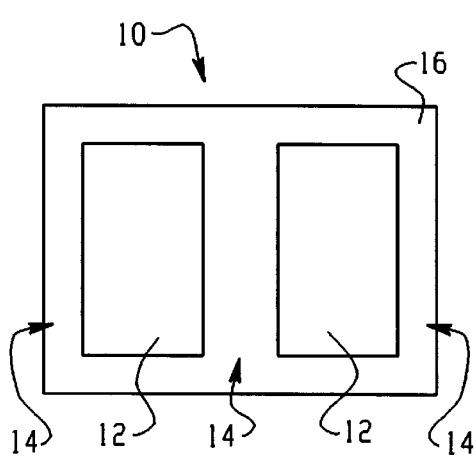
FIG. 1 is a plan view illustrating a prior art layout of a flash memory chip.
Figure 2:
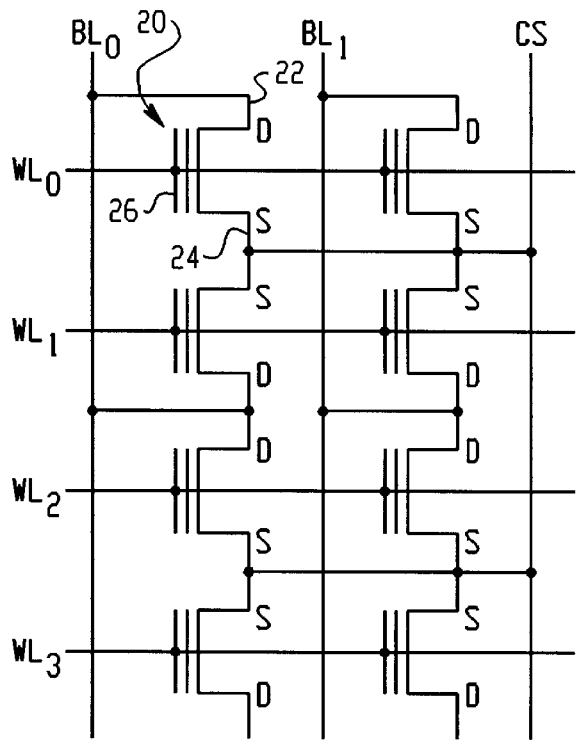
FIG. 2 is a schematic diagram illustrating a prior art core portion of a flash memory circuit.
Figure 3:
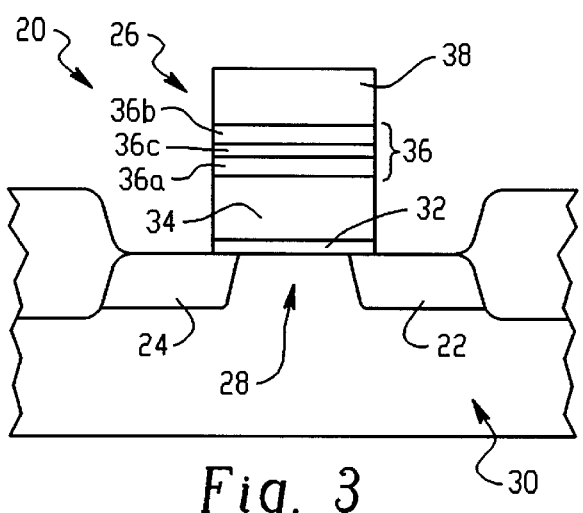
FIG. 3 is a fragmentary cross section illustrating a prior art stacked gate flash memory cell.
Figure 4A:
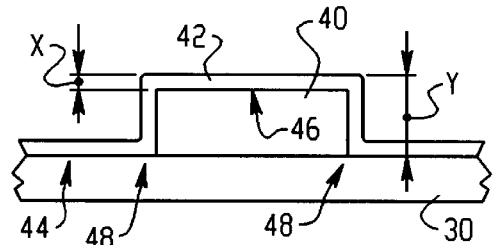
FIG. 4a is a fragmentary cross section illustrating a prior art polysilicon gate covered by an ONO layer.
Figure 4C:
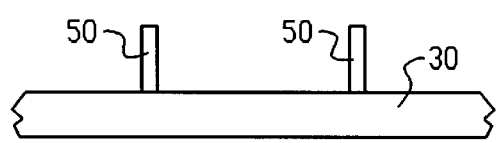
FIG. 4c is a fragmentary cross section illustrating a prior art etched polysilicon region having a remaining ONO fence.
Figure 4B:
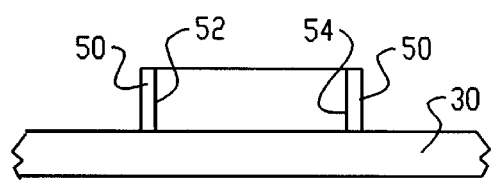
FIG. 4b is a fragmentary cross section illustrating a prior art polysilicon gate and an etched ONO layer forming an ONO fence.
Figure 5:
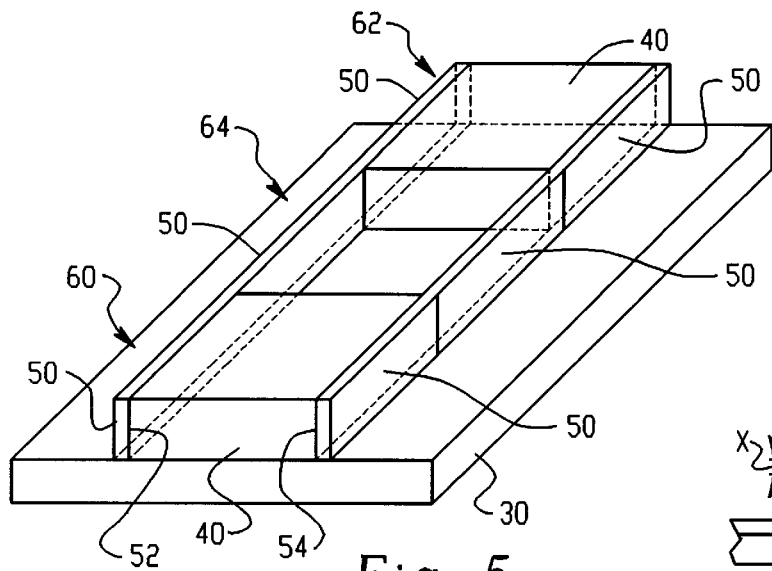
FIG. 5 is a perspective view of a prior art polysilicon gate region that has been etched to form separate word lines, wherein an ONO fence spans a region between the word lines.
Figure 6A:
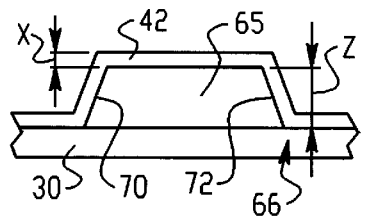
FIG. 6a is a fragmentary cross section illustrating a prior art polysilicon gate having a non-ideal anisotropically etched profile covered by an ONO layer.
Figure 6C:
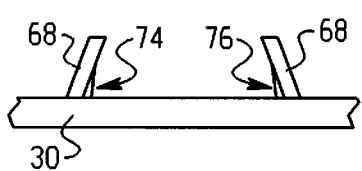
FIG. 6c is a fragmentary cross section illustrating a prior art etched polysilicon region having a remaining angled ONO fence and poly stringers.
Figure 6B:
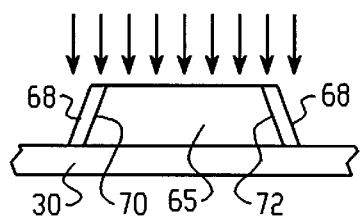
FIG. 6b is a fragmentary cross section illustrating a prior art polysilicon gate and an etched ONO layer forming an angled ONO fence.
Figure 7:
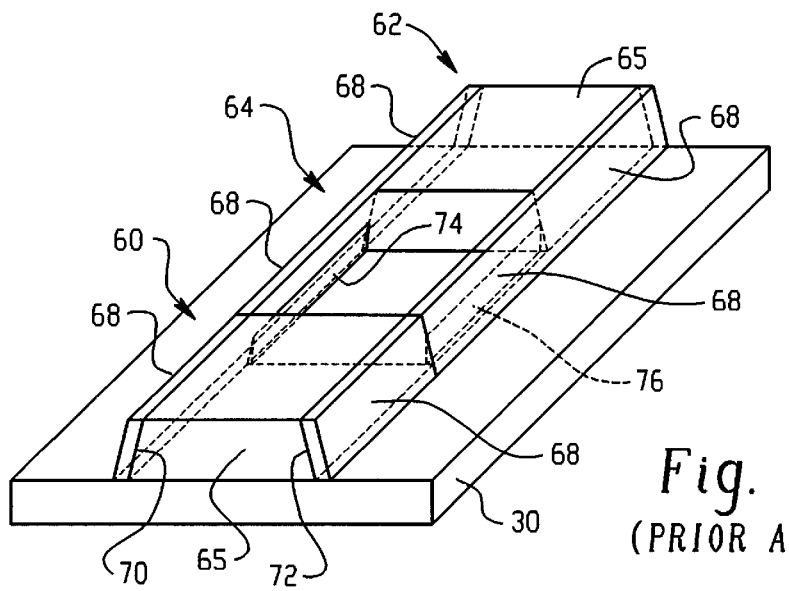
FIG. 7 is a perspective view of a prior art polysilicon gate region that has been etched to form separate word lines, wherein an angled ONO fence and poly stringers span a region between the word lines, thereby shorting the word lines together.

The present invention will now be described with reference to the drawings wherein like reference numerals are used to refer to like elements throughout. An embodiment of the present invention includes a method of forming a memory device substantially without poly stringers. The method includes forming a stacked gate region according to conventional methods and performing a new self-aligned etch ("SAE") to reduce the height of the ONO fence. The shorter ONO fence reduces its lateral shielding of polysilicon, thereby preventing the formation of poly stringers during the subsequent etching of the first layer of polysilicon. The reduced ONO fence prevents both poly1 and poly2 stringers which correspond to whether the polysilicon material is a remnant from the first polysilicon layer which is used to form the floating gate or a remnant from the second polysilicon layer which is used to form the control gate of a flash memory device.

In attempting to address the problem of poly stringers it was appreciated that the height of the ONO fence, which is created during the first step of the SAE, impacts whether poly stringers are created during the subsequent etching of the first polysilicon layer. In other words, the first step of the SAE impacts the formation of poly stringers during the second step of the SAE. This interrelation may best be understood in conjunction with FIGS. 8a–8c.

Figure 8A:
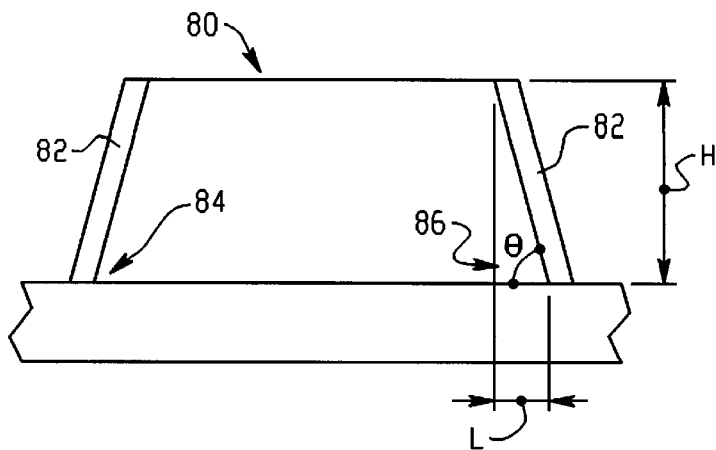
FIGS. 8a–8c are fragmentary cross sections illustrating how the height of the ONO fence impacts the formation of poly stringers.

FIG. 8a illustrates a non-ideal anisotropic polysilicon etch profile 80 having an etched ONO layer which results in an angled ONO fence 82. The angled ONO fence 82 has a height "H" that spans a lateral distance "L" based on the angle θ of the non-ideal anisotropic etch profile. For any given etch profile, the longer the lateral distance "AL" the ONO fence 82 extends, the greater the possibility of poly stringer formation in the regions 84 and 86 due to the shielding of the polysilicon material 84 beneath the angled ONO fence 82 (called poly1 stringers). The lateral distance "L" may be calculated by the formula:

$$L = H/\tan\theta.$$

Figure 8B:
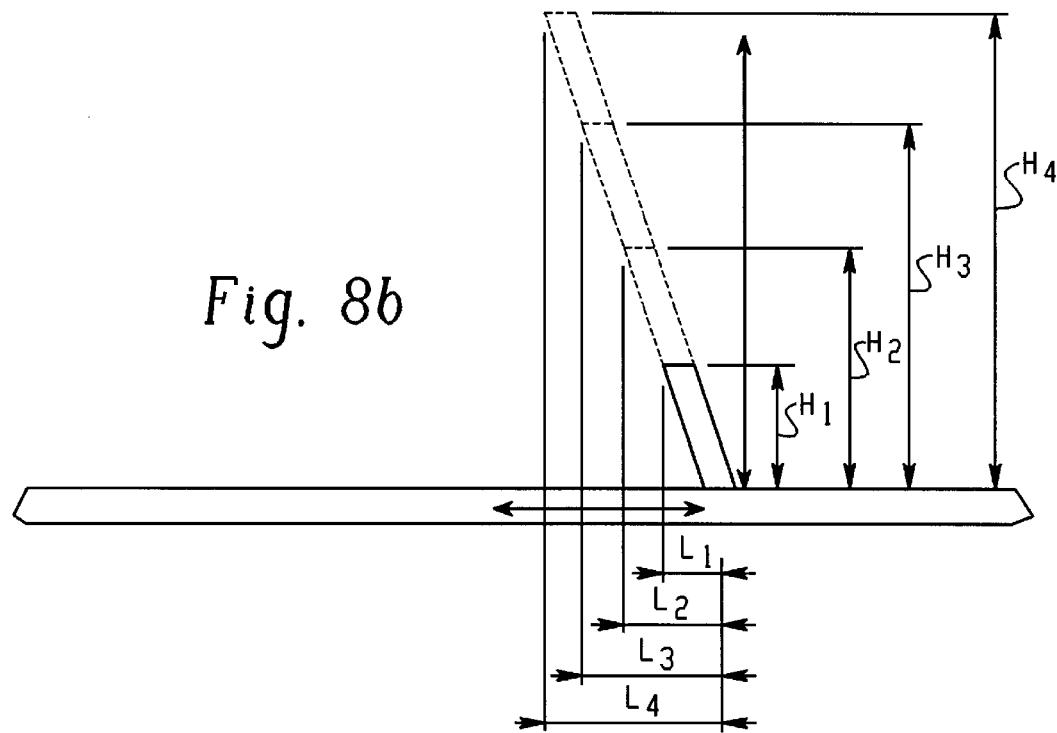

Therefore for a given etch profile 80 (wherein θ is constant), as the height "H" of the ONO fence 82 increases, the lateral distance "L" also increases. Likewise, as the height "H" of the ONO fence 82 decreases, the lateral distance "L" is also decreased, as illustrated in FIG. 8b.

Figure 8C:
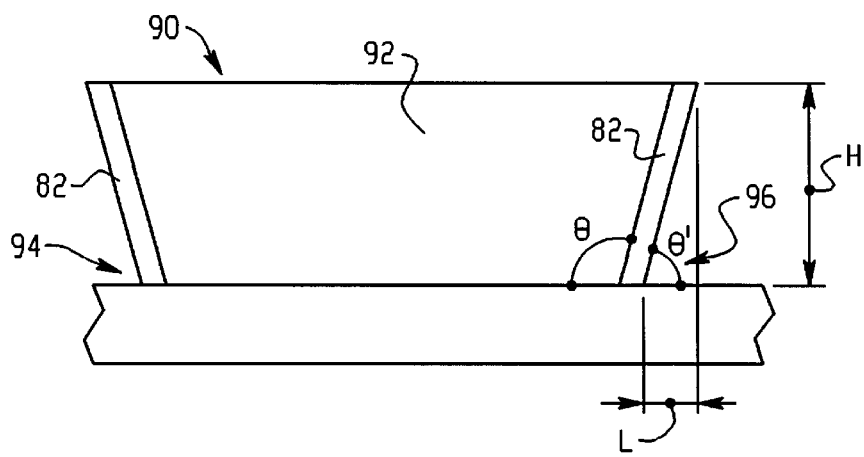

Furthermore, as illustrated in FIG. 8c, this relationship between the height "H" and lateral distance "L" of the angled ONO fence 82 for a given profile θ' (wherein θ'=180°−θ) also holds for non-ideal anisotropic profiles that are greater than 90°. When θ'>90°, an etch profile 90 is achieved. Although the polysilicon 92 within the ONO fence 82 will be completely etched away during the SAE, the polysilicon (not shown) which previously overlaid the ONO layer (the second polysilicon layer that forms the control gate as will be discussed in greater detail infra) will be shielded by the ONO fence 82 and cause poly2 stringers in the regions 94 and 96.

The present invention decreases the height of the ONO fence 82 during semiconductor device processing to thereby minimize the lateral distance "L" for a given non-ideal anisotropic etch profile. Furthermore, the decrease in the height of the ONO fence prevents the formation of poly stringers (both poly1 and poly2 stringers depending on the etch profile), thereby substantially improving the manufacturability of the memory devices.

Figure 9A:
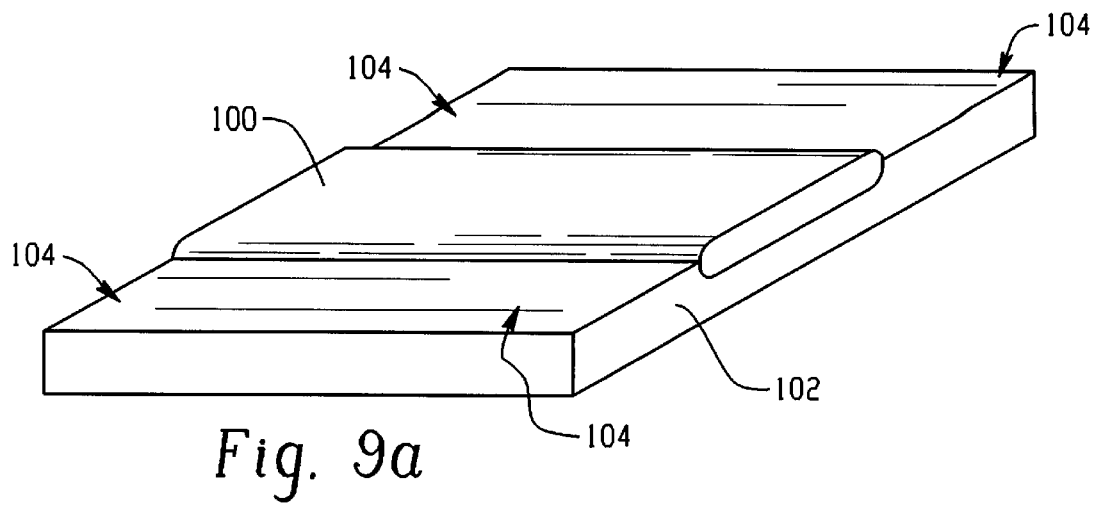
FIGS. 9a–9k are perspective views illustrating a method according to the present invention for forming a flash memory device without poly stringers.

A method of forming a flash memory cell without poly stringers according to one aspect of the present invention will be described in conjunction with FIGS. 9a–9j. The manufacture of a flash memory cell according to one exemplary embodiment of the present invention begins with the formation of one or more field oxide regions 100 in a semiconductor substrate 102, as illustrated in FIG. 9a. The field oxide region 100 is conventionally formed by, for example, growing a layer of thermal oxide (also called "barrier oxide" or "pad oxide") over the surface of the substrate 102. A masking layer (not shown), frequently composed of nitride, is deposited on the barrier oxide and patterned to cover regions 104 of the substrate 102 in which memory cells are to be formed. After patterning the masking layer, the field oxide 100 is grown to a thickness of about 6,500 Angstroms in the exposed areas of the thermal oxide by, for example, local oxidation of silicon ("LOCOS"). The field oxide region 100 will provide electrical isolation between the various active regions 104 in which the memory cells will lie. After growing the field oxide 100, the masking layer and thermal oxide are stripped to expose the underlying substrate 102 in the regions 104, as illustrated in FIG. 9a.

Figure 9B:
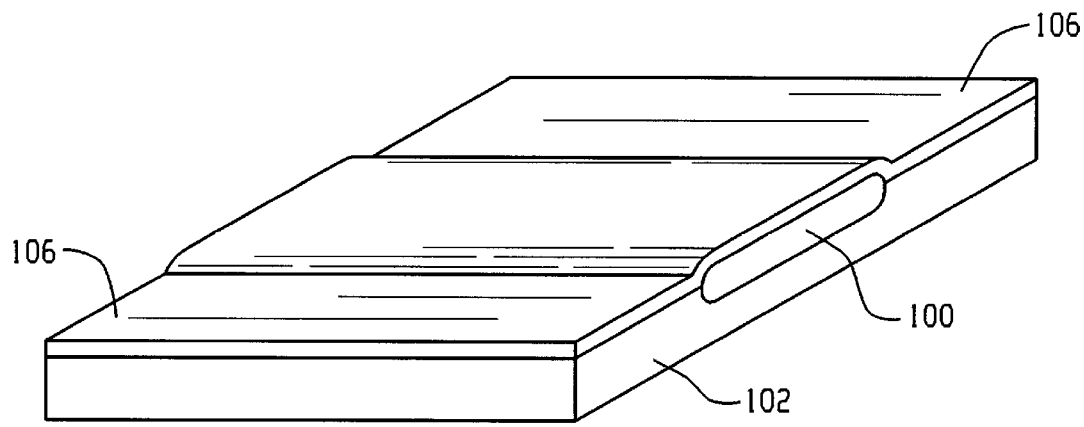

After the formation of the field oxide regions 100, a thin tunnel oxide layer (not shown) is formed over the substrate 102 having a thickness of, for example, about 50–150 Angstroms using a thermal growth process in a dry oxidation furnace. After formation of the tunnel oxide, a first layer of polycrystalline silicon 106 ("polysilicon") having a thickness of about 700 Angstroms is deposited via, for example, low pressure chemical vapor deposition ("LPCVD") and doped via, for example, diffusion doping or ion implantation doping techniques to thereby make the first polysilicon layer less resistive. The deposited first polysilicon layer 106 is illustrated in FIG. 9b. (Note that the tunnel oxide underlies the first polysilicon layer 106, however, due to its relative thinness and for the sake of simplicity, the tunnel oxide layer is not shown in the figures.)

Figure 9C:
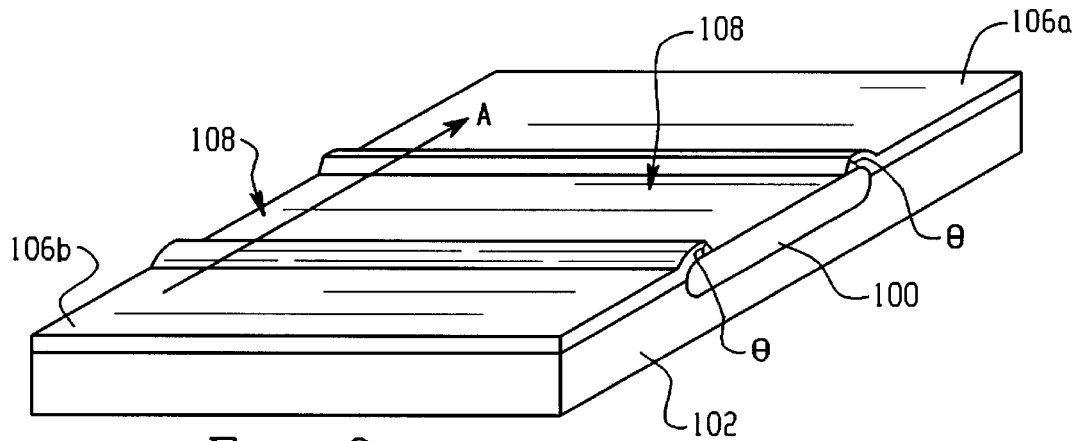

Subsequent to the deposition and doping of the first polysilicon layer 106, the layer 106 is etched to define the memory cells along the length of a single word line (which has not yet been defined), as illustrated in FIG. 9c. The layer 106 is etched using a dry etch such as, for example, a reactive ion etching process ("RIE") using a HBrHeO$_2$ etch chemistry. The etching step removes polysilicon in a region 108 which overlies a substantial portion of the field oxide region 100, thereby separating the polysilicon layer 106 into two or more regions 106a and 106b, respectively, which are separated from one another by the field oxide region 100. This etch step defines various memory cells along the direction "A", as illustrated in FIG. 9c. The direction "A" is the direction in which the word lines (which will be formed later in the process) will extend and wherein each region 106a and 106b of the first polysilicon layer 106 will form a separate floating gate for a cell along a given word line. The non-ideal anisotropic etching of the first polysilicon layer 106 dictates the profile angle θ, as illustrated in FIGS. 8a, 8c and 9c.

Figure 9D:
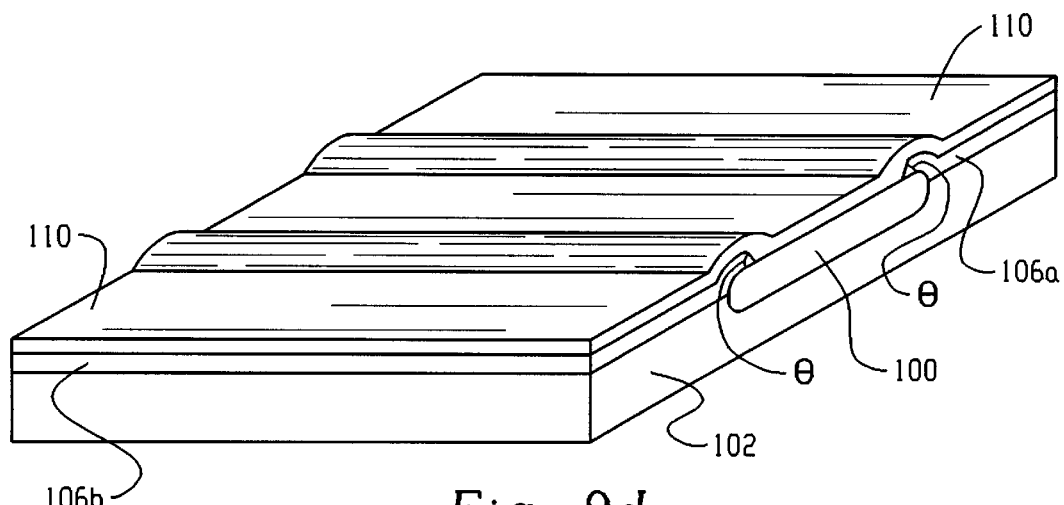

A multi-layer interpoly dielectric 110 is then formed over the surface of the substrate 102, as illustrated in FIG. 9d. This layer 110 is often called the interpoly dielectric since (as will be seen shortly) it is sandwiched between the first polysilicon layer 106 (the floating gate for each flash memory cell) and a second polysilicon layer which forms the control gate for each cell as well as the word line interconnect for each of the flash cells associated with a given word line. The interpoly dielectric 110 is preferably a three layer region of oxide/nitride/oxide (also called "ONO") and has an overall thickness of about 120 Angstroms. The ONO layer 110 is formed by repetitive depositions of oxide, nitride and oxide as is well known by those skilled in the art to form a dielectric layer in which the nitride is sandwiched between the two oxide layers. The ONO layer 110 overlies the entire surface of the substrate 102, including the region 108 in which the first polysilicon layer 106 was etched.

Figure 9E:
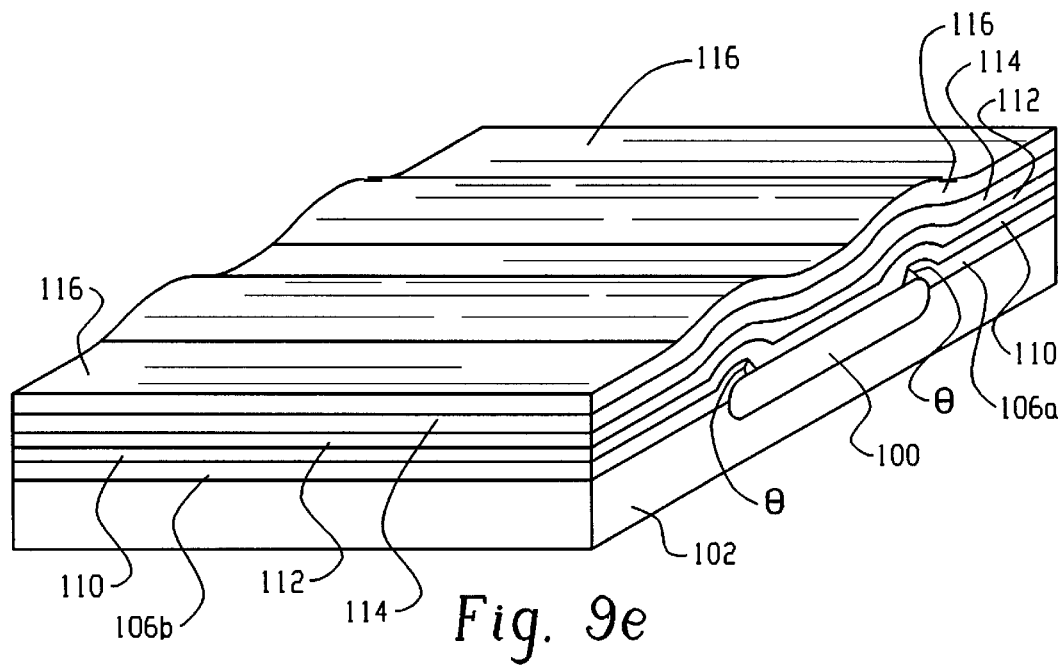

After the formation of the ONO layer 110, the remaining layers, which will complete the stack for each flash memory cell, are formed. These layers include a second polysilicon layer 112, a tungsten layer 114 (for formation of a tungsten silicide as will be described supra) and a top layer 116 consisting of an oxynitride, as illustrated in FIG. 9e.

The second polysilicon layer 112 is deposited via, for example, LPCVD and will, in conjunction with the tungsten layer 114, form the control gate for each flash cell. The second polysilicon layer 112 is also doped in a manner similar to the first polysilicon layer 106 to lower the resistivity of the region. The tungsten layer 114 is then formed by, for example, sputtering and a tungsten silicide layer is then formed by performing a thermal anneal, causing the tungsten layer 114 to react with a portion of the underlying polysilicon 112 at the interface of the two layers to form a tungsten silicide layer 118 ($WSi_x$). The silicide layer 118 provides a lower resistance contact for improved flash memory cell performance. The top layer 116 is an oxynitride layer (SiON) formed via, for example, plasma enhanced chemical vapor deposition ("PECVD") and has a thickness of about 500 Angstroms and may provide an anti-reflective coating and prevent any potential peeling or cracking of the underlying tungsten silicide 118.

Figure 9F:
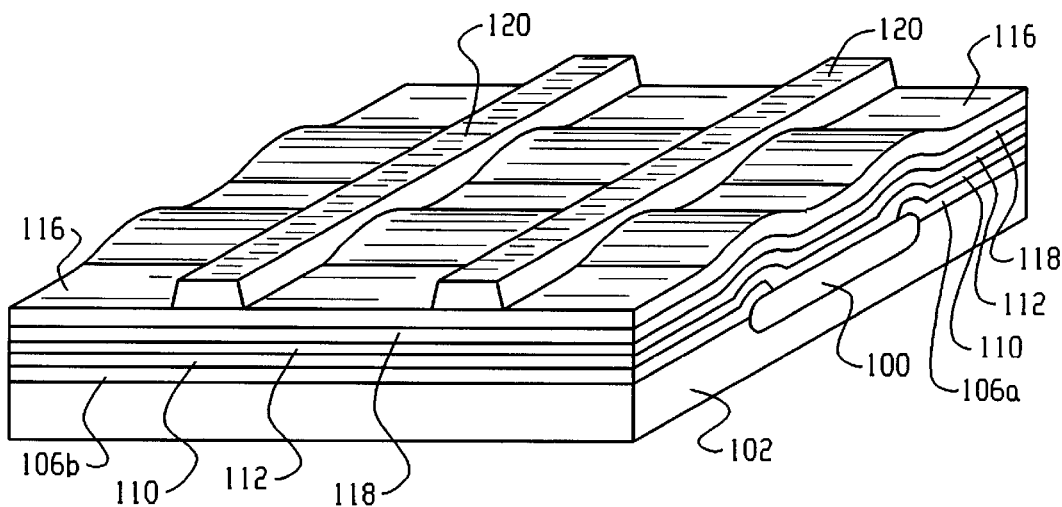
Figure 9G:
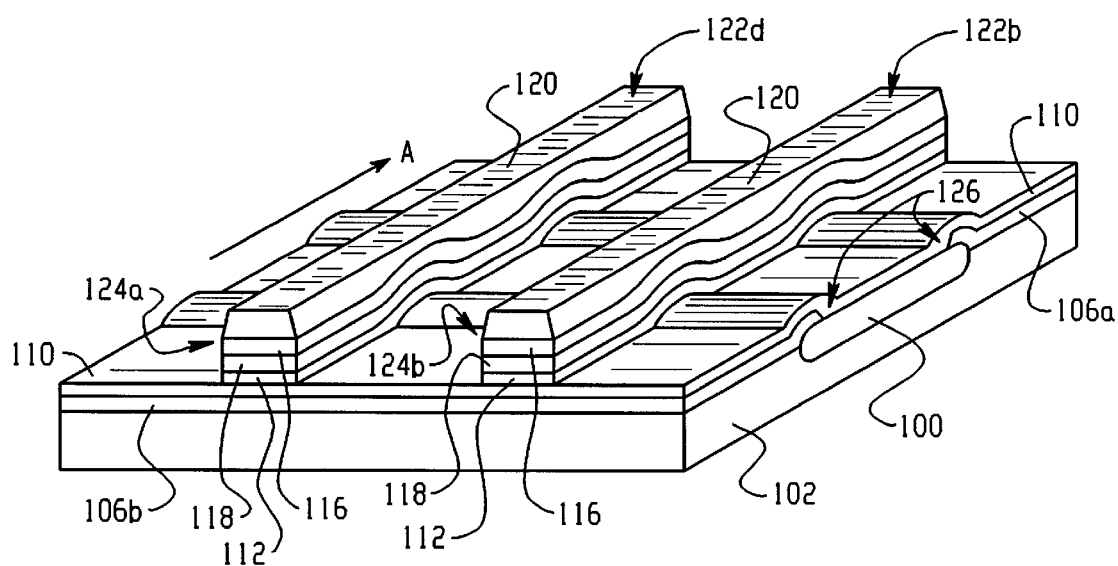
Figure 9H:
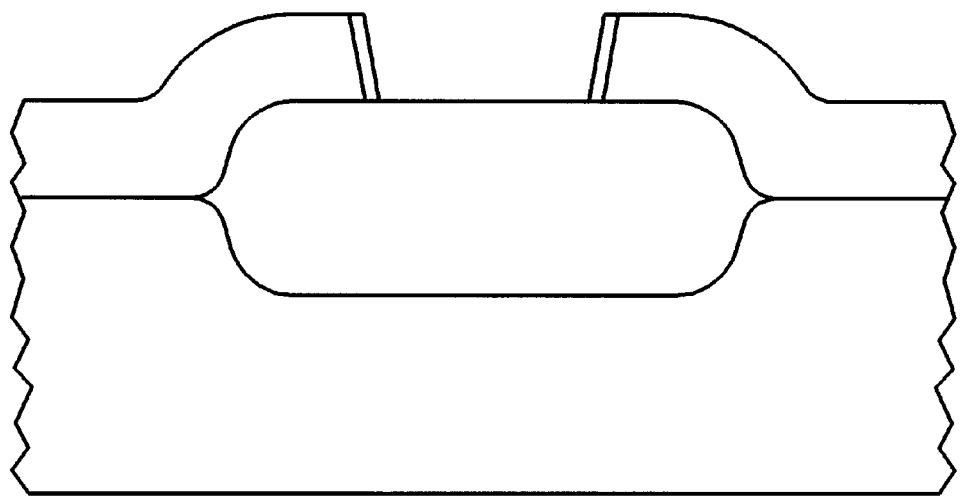

After the second polysilicon layer 112, tungsten silicide layer 118 and top layer 116 of the memory stack structure have been formed, a plurality of word lines for the memory cells are defined by etching, thereby creating stack structures. The etching is achieved by depositing and defining a photoresist masking layer 120 of approximately 8,000 Angstroms over the entire surface of the substrate 102, as illustrated in FIG. 9f. Subsequently, a number of successive etching steps are performed. The top layer 116 is etched, for example, in an oxide chamber and then transferred to a poly chamber for etching of the tungsten silicide layer 118 and the second polysilicon layer 112 according to conventional etching methods as is well known by those skilled in the art. The remaining word lines 122a and 122b are defined by stack structures 124a and 124b (after each of the above etch steps is completed), as illustrated in FIG. 9g. Note that in this structure the word lines 122a and 122b are formed in the direction "A" which is transverse to the etching of the first polysilicon layers 106a and 106b, respectively.

Once the second polysilicon layer 112, the tungsten silicide layer 118 and the top SiON layer 116 have been removed, a self-align etch ("SAE") is performed to remove the ONO layer 110 and the first polysilicon regions 106a and 106b in the regions that are not covered by the stack structures 124a and 124b. The SAE etch is a two step etch process in which the ONO layer 110 is first removed using a new etch recipe that reduces the height of the remaining ONO fence without substantially impacting the underlying first polysilicon layer (regions 106a and 106b).

In the conventional, prior art ONO etch recipes (e.g., a $CF_4O_2$ RIE etch having a $CF_4$ flow rate of 54 sccm (standard cubic centimeters per minute), and $O_2$ flow rate of 10 sccm, a pressure of 25 mTorr and a power of 100 W), a low ONO-to-polysilicon selectivity (of approximately 1:1) etch was performed to remove the ONO layer 110. As is well known by those skilled in the art, the selectivity of an etch is a ratio of etch rates of different materials. Therefore a selectivity of 1:1 indicates that the etch chemistry etches the ONO at the same rate as the underlying polysilicon. Since the prior art ONO etch had poor selectivity, any overetching of the ONO layer 110 resulted in an undesirable etching of the underlying polysilicon (either layer 106a or 106b). Consequently, substantially no overetch was performed and an ONO fence 82 was left that was as tall as the polysilicon, as illustrated in prior art FIG. 9h.

Figure 9I:
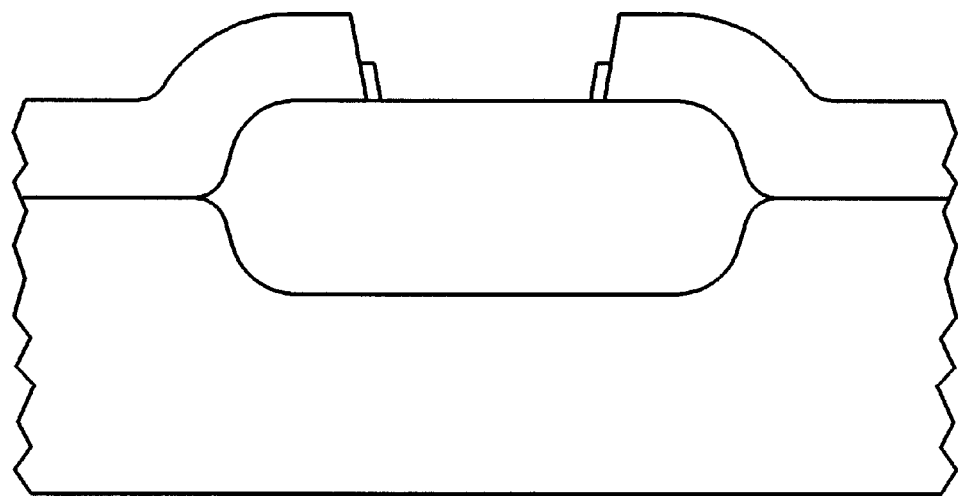

The ONO etch according to the present invention incorporates a high ONO-to-polysilicon selectivity (preferably in the range of about 3:1 or more) so that an ONO overetch may be performed to reduce substantially the height of the remaining ONO fence without substantially impacting the underlying polysilicon (regions 106a and 106b). Even higher selectivities are contemplated as falling within the present invention, however, the selectivity cannot be increased indiscriminately since eventually higher ONO-to-polysilicon etch selectivities result in excessive polymer formation which undesirably interferes with the subsequent etching of the first polysilicon layer. Therefore it is desirable to increase the ONO-to-polysilicon selectivity as high as possible without generating excessive polymer material on the underlying polysilicon. The resultant ONO fence 126, as illustrated in FIGS. 9i and 9j, is substantially shorter than the prior art ONO fence 82, thereby exhibiting less lateral shielding of the underlying polysilicon and preventing or otherwise substantially reducing the formation of poly stringers.

According to one embodiment of the present invention, the high selectivity ONO-to-polysilicon etch includes a $CF_4CHF_3O_2$ etch chemistry, wherein the $CF_4$ has a volumetric flow rate of about 40 sccm, the $CHF_3$ has a flow rate of about 15 sccm and the $O_2$ has a flow rate of about 10 sccm. The gas combination is excited in a chamber to form a plasma, wherein the chamber pressure is about 25 mTorr and the excitation power is about 170 W. Although the above etch conditions are preferred, it should be understood that the high selectivity ONO etch is not limited to the above etch recipe, but rather contemplates any etch recipe that provides a substantially greater ONO-to-polysilicon selectivity than the prior art, that is, a selectivity greater than about 1:1.

In addition, although the present invention is disclosed with ONO as the interpoly dielectric, the present invention is equally applicable to any type of insulative material that forms the interpoly dielectric. In such case, an SAE etch is selected which exhibits a substantially high selectivity between the insulator and the polysilicon to reduce the insulative fence and thereby prevent the subsequent formation of poly stringers.

Figure 9J:
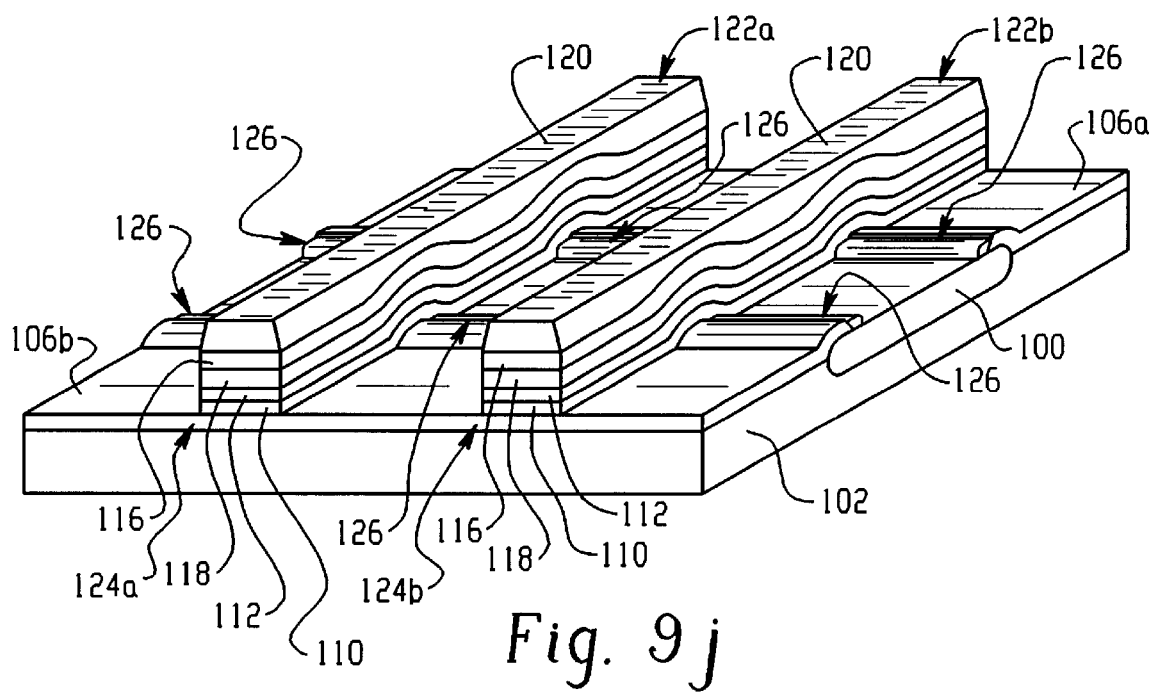

The reduced ONO fence 126 is illustrated in its macroscopic context in FIG. 9j. Note that most of the ONO layer 110 having a thickness of about 120 Angstroms is removed, however, the regions 126 that overlie the steps of the first polysilicon regions 106a and 106b remain. These regions, which originally (before the SAE) had a substantially greater thickness than 400 Angstroms, constitute the reduced height ONO fence.

The second phase of the SAE etch is the removal of the exposed polysilicon regions 106a and 106b thereby further to define the floating gate structures for each respective word line 122a and 122b. The polysilicon etch includes, for example, an $HBrClO_2$ RIE etch chemistry that is highly anisotropic. Since the ONO fences 126 are short, even though the fences 126 are angled (due to a non-ideal anisotropic etch profile), portions of the underlying polysilicon layers 106a and 106b are not sufficiently shielded to result in any remnants (the poly stringers). Therefore no poly stringers are formed and the potential reliability issue of shorted word lines due to the poly stringers is eliminated. The absence of poly stringers after the poly etch is illustrated in FIG. 9k.

Figure 9K:
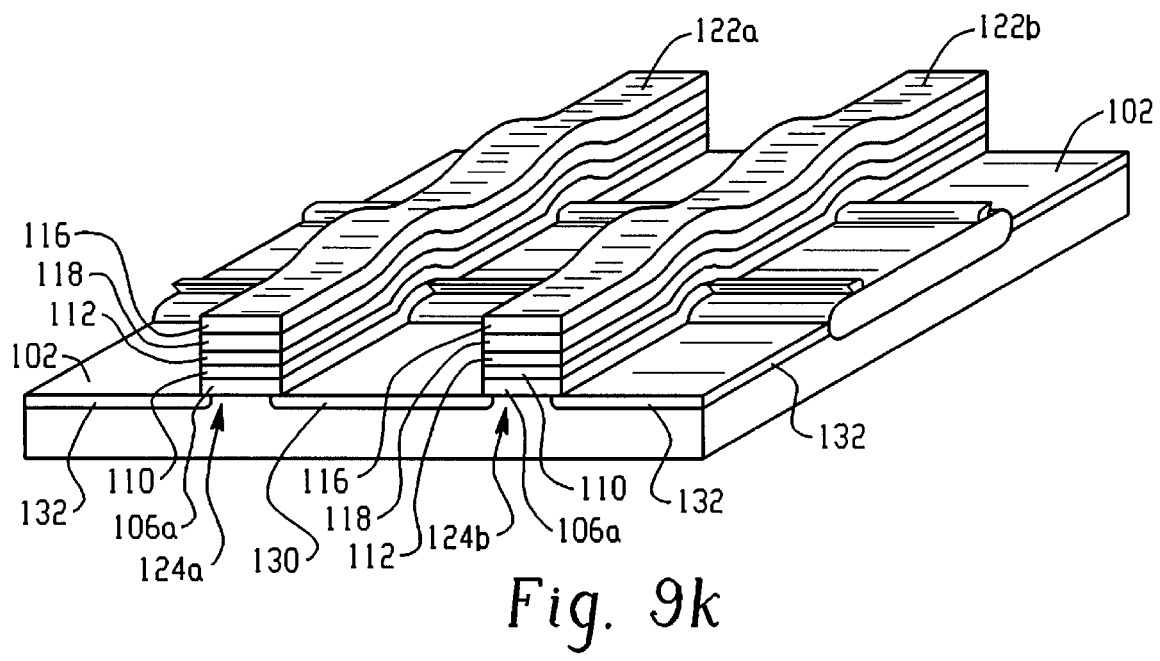

The fabrication of the flash memory cells is then completed by forming the source and drain regions 130 and 132, respectively by, for example ion implantation which are illustrated in FIG. 9k. During the formation of the source and drain regions 130 and 132, the stacked gate structures 124a and 124b serve as self-aligning mechanisms. After formation of the source and drain regions 130 and 132, the resist mask 120 is removed. In the above manner, an easy method for forming flash memory cells without poly stringers is provided.

Figure 10:
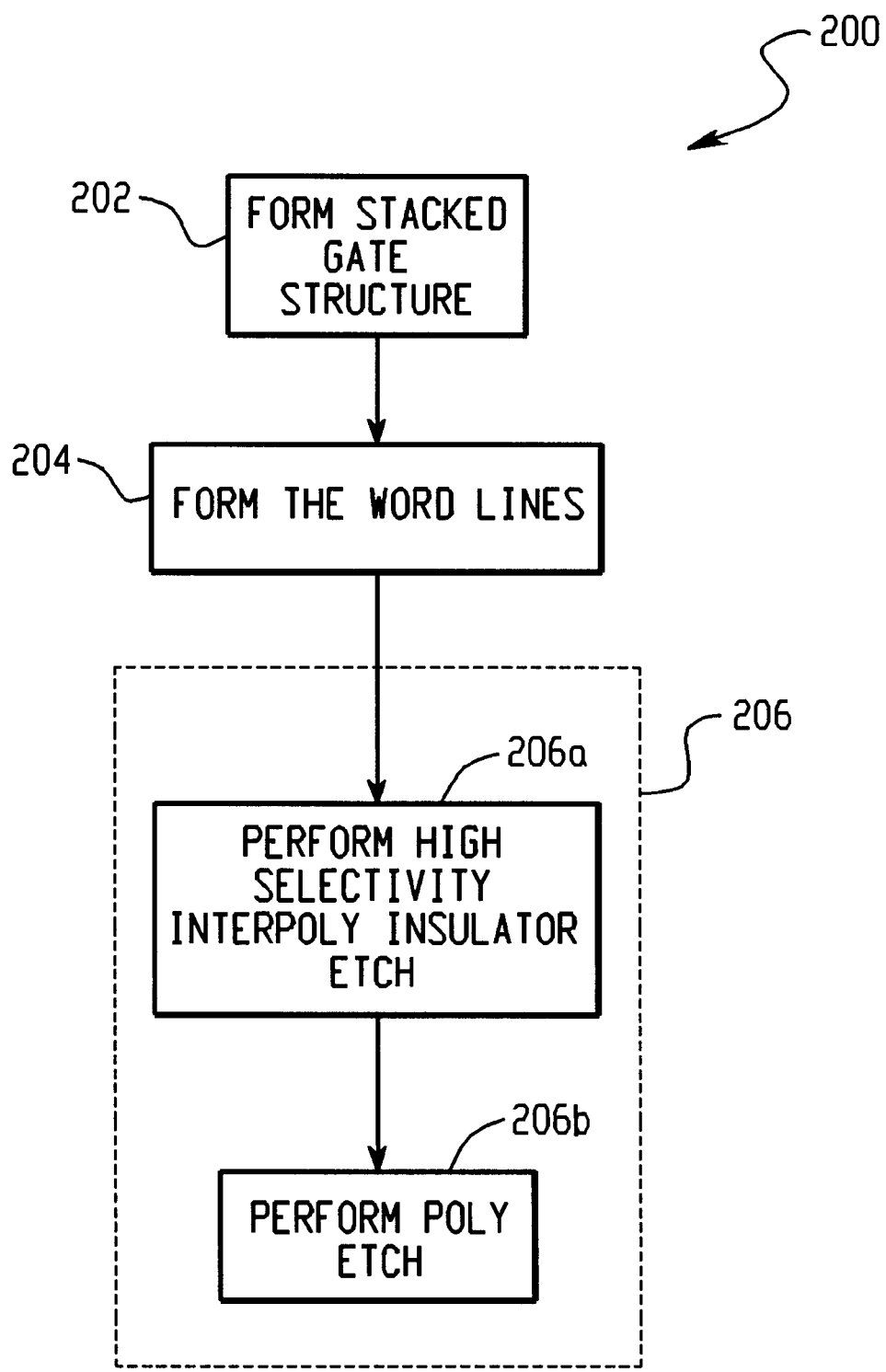
FIG. 10 is a flow chart illustrating manufacturing steps in a method for forming a flash memory without poly stringers in accordance with the embodiment of the present invention exemplified in FIGS. 9a–9k.

Although the present invention has been described in conjunction with a particular set of exemplary processing steps, the method is equally applicable to any semiconductor manufacturing process in which a flash memory device having a stacked gate structure is fabricated. This method is illustrated in the flowchart of FIG. 10. The method 200 includes the step of forming the stacked gate structure at step 202. Any method by which a stacked gate structure may be formed is contemplated as falling within the scope of the present invention. Forming the stacked gate structure 202 includes depositing the polysilicon and insulative layers and etching the floating gate layer (the first polysilicon layer) to define the various memory cells along a word line. Next, the word lines are formed by delineating one word line from another at step 204. Although this step is preferably accomplished by successive etch steps to remove various stack layers in regions between the desired word lines, any method by which the word lines are formed are contemplated as falling within the scope of the present invention.

After delineating the word lines at step 204, a self-align etch (SAE) process is employed at step 206 to remove the first polysilicon layer and the overlying ONO layer in the regions between the desired word lines. The SAE 206 is a two step process in which the first step 206a includes performing a high selectivity insulator etch. The etch exhibits a substantially greater insulator-to-polysilicon selectivity than the prior art, thereby allowing an overetch to substantially reduce the height of the insulative fence without substantially impacting the underlying polysilicon. The second step 206b includes an anisotropic polysilicon etch to complete the defining of the word lines. Since the reduced insulative fence formed at step 206a does not substantially shield any polysilicon, the polysilicon etch of step 206b removes the polysilicon without any poly stringers left behind. After the SAE of step 206 the word lines are fully defined. Subsequent processing is then performed to form the source and drain regions in the substrate as is well known by those skilled in the art.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of preventing poly stringers in a memory device, comprising the steps of:

forming a stacked gate region on a substrate, the stacked gate region including a polysilicon layer underlying an insulating layer;

forming one or more word lines in the stacked gate region;

etching the insulating layer in regions adjacent the one or more word lines, wherein the etching of the insulating layer exhibits a substantially high insulating layer-to-polysilicon selectivity, thereby substantially reducing the height of a resultant insulative fence without substantially impacting the polysilicon layer; and etching the polysilicon layer in regions adjacent the one or more word lines, wherein the etching of the polysilicon layer is substantially anisotropic and removes substantially all the polysilicon, resulting in the prevention of poly stringers.

2. The method of claim 1, wherein the step of forming a stacked gate region on a substrate comprises the steps of:

forming a tunnel oxide;

forming a first conductive region over the tunnel oxide;

forming an insulative region over the first conductive region; and forming a second conductive region over the insulative region.

3. The method of claim 2, further comprising etching the first conductive region to define one or more memory cells within a word line before the forming of the insulative region.

4. The method of claim 2, wherein the step of forming a first conductive region comprises depositing a polycrystalline layer and doping the polycrystalline layer with impurity ions.

5. The method of claim 2, wherein the step of forming the insulative region comprises the steps of:

forming a first oxide layer;

forming a nitride layer over the first oxide layer; and forming a second oxide layer over the nitride layer.

6. The method of claim 2, wherein the step of forming the second conductive layer comprises depositing a polycrystalline layer and doping the polycrystalline layer with impurity ions.

7. The method of claim 6, wherein forming the second conductive layer further comprises:

depositing a metal layer over the polycrystalline layer; and performing a thermal treatment, thereby causing the metal layer and the polycrystalline layer to react at an interface of the two layers, thereby forming a silicide.

8. The method of claim 1, wherein forming one or more word lines comprises the steps of etching a conductive layer into one or more regions, wherein the one or more regions define the one or more word lines.

9. The method of claim 1, wherein etching the insulative layer comprises overetching the insulative layer in regions adjacent to the one or more word lines, wherein the insulative region is substantially removed and one or more fences remain and wherein the fences are shorter than a thickness of the polysilicon layer.

10. The method of claim 1, wherein the substantially high insulating layer-to-polysilicon layer selectivity is at least about 3:1.

11. The method of claim 1, wherein etching the insulative layer comprises etching the insulative layer with a $CF_4CHF_3O_2$ plasma etch, wherein the flow rate of $CF_4$ is about 40 sccm, the flow rate of $CHF_3$ is about 15 sccm and the flow rate of $O_2$ is about 10 sccm, and wherein a chamber pressure is about 25 mTorr and an excitation power is about 170 W.

12. A method of forming a flash memory device, comprising the steps of:

forming a tunnel oxide on a substrate;

forming a first conductive layer on the tunnel oxide;

forming an insulating layer on the first conductive layer;

forming a second conductive layer on the insulating layer;

etching the second conductive layer, thereby defining one or more stacked gate structures;

etching the insulating layer in regions adjacent to the stacked gate structures, wherein the etch exhibits a substantially high insulating layer-to-first conductive layer selectivity, thereby substantially reducing the height of a resultant insulative fence without substantially impacting the first conductive layer;

etching the first conductive layer in regions adjacent to the stacked gate structures, wherein the etching of the first conductive layer is substantially anisotropic and removes substantially all the first conductive layer, resulting in the prevention of conductive remnants; and forming a source region and a drain region in the substrate, wherein the source region and the drain region are self-aligned by the stacked gate structures, thereby forming one or more memory cells.

13. The method of claim 12, wherein the step of forming the second conductive layer further comprises the steps of:

forming a metal layer over the polysilicon;

converting the metal layer and the polysilicon layer into a silicide overlying the polysilicon layer; and forming an oxynitride layer over the silicide.

14. The method of claim 12, wherein etching the insulating layer comprises overetching the insulating layer in regions adjacent to the stacked gate structures, wherein the insulating layer is substantially removed and one or more insulating fences remain and wherein the insulating fences are shorter than a thickness of the first conductive layer.

15. The method of claim 12, wherein the substantially high insulating layer-to-first conductive layer selectivity is at least about 3:1.

16. The method of claim 12, wherein etching the insulating layer comprises etching the insulating layer with a $CF_4CHF_3O_2$ plasma etch, wherein the flow rate of $CF_4$ is about 40 sccm, the flow rate of $CHF_3$ is about 15 sccm and the flow rate of $O_2$ is about 10 sccm, and wherein a chamber pressure is about 25 mTorr and an excitation power is about 170 W.

* * * * *